(12) United States Patent
Herner

(10) Patent No.: US 8,809,831 B2
(45) Date of Patent: Aug. 19, 2014

(54) ON/OFF RATIO FOR NON-VOLATILE MEMORY DEVICE AND METHOD

(75) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/436,714

(22) Filed: Mar. 30, 2012

(65) Prior Publication Data

US 2012/0187364 A1    Jul. 26, 2012

Related U.S. Application Data

(62) Division of application No. 12/835,699, filed on Jul. 13, 2010, now Pat. No. 8,168,506.

(51) Int. Cl.
*H01L 27/24* (2006.01)

(52) U.S. Cl.
USPC ..................................... 257/5; 257/E27.004

(58) Field of Classification Search
None
See application file for complete search history.

(56) References Cited

U.S. PATENT DOCUMENTS

| | | | |
|---|---|---|---|
| 680,652 A | 8/1901 | Elden | |
| 4,433,468 A | 2/1984 | Kawamata | |
| 4,684,972 A | 8/1987 | Owen et al. | |
| 4,741,601 A | 5/1988 | Saito | |
| 5,139,911 A | 8/1992 | Yagi et al. | |
| 5,242,855 A | 9/1993 | Oguro | |
| 5,278,085 A | 1/1994 | Maddox, III et al. | |
| 5,315,131 A | 5/1994 | Kishimoto et al. | |
| 5,335,219 A | 8/1994 | Ovshinsky et al. | |
| 5,360,981 A | 11/1994 | Owen et al. | |
| 5,457,649 A | 10/1995 | Eichman et al. | |
| 5,538,564 A | 7/1996 | Kaschmitter | |
| 5,541,869 A | 7/1996 | Rose et al. | |
| 5,594,363 A | 1/1997 | Freeman et al. | |
| 5,614,756 A | 3/1997 | Forouhi et al. | |
| 5,707,487 A | 1/1998 | Hori et al. | |

(Continued)

FOREIGN PATENT DOCUMENTS

| EP | 2405441 A1 | 1/2012 |
|---|---|---|
| EP | 2408035 A2 | 1/2012 |

(Continued)

OTHER PUBLICATIONS

Office Action for U.S. Appl. No. 12/814,410 dated April 17, 2012.

(Continued)

*Primary Examiner* — Charles Garber
*Assistant Examiner* — Stanetta Isaac
(74) *Attorney, Agent, or Firm* — Ogawa P.C.

(57) ABSTRACT

A switching device includes a first dielectric material formed overlying a substrate. A bottom wiring material and a switching material are sequentially formed overlying the first dielectric material. The bottom wiring material and the switching material are patterned and etched to form a first structure having a top surface region and a side region. The first structure includes a bottom wiring structure and a switching element having the top surface region including an exposed region. A second dielectric material is formed overlying the first structure. A first opening region is formed in a portion of the second dielectric layer to expose a portion of the top surface region. A dielectric side wall structure is formed overlying a side region of the first opening region. A top wiring material including a conductive material is formed overlying the top surface region to be directly contact with the switching element.

19 Claims, 13 Drawing Sheets

(56) References Cited

U.S. PATENT DOCUMENTS

| | | |
|---|---|---|
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,521,705 B2 | 4/2009 | Liu |
| 7,534,625 B2 | 5/2009 | Karpov et al. |
| 7,550,380 B2 | 6/2009 | Elkins et al. |
| 7,606,059 B2 | 10/2009 | Toda |
| 7,615,439 B1 | 11/2009 | Schricker et al. |
| 7,629,198 B2 | 12/2009 | Kumar et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,858,468 B2 | 12/2010 | Liu et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 7,984,776 B2 | 7/2011 | Beyer et al. |
| 8,004,882 B2 | 8/2011 | Katti et al. |
| 8,018,760 B2 | 9/2011 | Muraoka et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 2,405,441 A1 | 1/2012 | Lu |
| 2,408,035 A1 | 1/2012 | Herner et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Albano et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,265,136 B2 | 9/2012 | Hong et al. |
| 8,274,812 B2 | 9/2012 | Jo et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,467,227 B1 | 6/2013 | Jo |
| 8,658,476 B1 | 2/2014 | Sun et al. |
| 8,659,003 B2 | 2/2014 | Herner et al. |
| 2003/0052330 A1 | 3/2003 | Klein |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0175099 A1 | 8/2005 | Sarkijarvi et al. |
| 2006/0017488 A1 | 1/2006 | Hsu |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |

(56) References Cited

U.S. PATENT DOCUMENTS

| | | |
|---|---|---|
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1 | 8/2011 | Costa et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1* | 12/2011 | Jo et al. ................. 365/148 |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043621 A1 | 2/2012 | Herner |
| 2012/0043654 A1 | 2/2012 | Lu et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |

FOREIGN PATENT DOCUMENTS

| | | |
|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 1020110014248 A | 10/2011 |
| WO | WO 03/034498 A1 | 4/2003 |
| WO | WO 2009/005699 A1 | 1/2009 |

OTHER PUBLICATIONS

Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Office Action for U.S. Appl. No. 12/913,719 dated Feb. 17, 2011.
Office Action for U.S. Appl. No. 12/913,719 dated Jul. 22, 2011.
Notice of Allowance for U.S. Appl. No. 12/913,719 dated Mar. 12, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al, "Aluminnum spiking at contact windows in Al/Ti-W/Si", Appl. Phys. Lett. Jan. 25, 1988, pp. 272-274, vol. 52 No. 4, American Institute of Physics.
J.Del Alamo et al, "Operating limits of Al-alloyed high-low junction for BSF solar cells", Solid State Electronics, 1981, pp. 415-420, vol. 24, Pergamon Press Ltd., Great Britain.
Hao-Chih Yuan et al, "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory,San Diego, California.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/149,653 dated Nov. 20, 2012.
Office Action of U.S. Appl. No. 13/436,714 dated Dec. 7, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.

(56) References Cited

OTHER PUBLICATIONS

Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and disturb prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Notice of Allowance for U.S. Appl. No. 13/679,976, dated Sep. 17, 2013.
Office Action for U.S. Appl. No. 13/189,401 dated Sep. 30, 2013.
Office Action for U.S. Appl. No. 13/462,653 dated Sep. 30, 2013.
Corrected Notice of Allowability for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665 dated Aug. 2, 2013.
Notice of Allowance for U.S. Appl. No. 13/769,152, dated Oct. 8, 2013.
Notice of Allowance for U.S. Appl. No. 13/905,074 , dated Oct. 8, 2013.
Notice of Allowability for U.S. Appl. No. 13/452,657, dated Oct. 10, 2013.
Notice of Allowance for U.S. Appl. No. 13/174,264, dated Oct. 16, 2013.
Notice of Allowability for U.S. Appl. No. 13/417,135, dated Oct. 23, 2013.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.
André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60,1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.

(56) References Cited

OTHER PUBLICATIONS

Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.

European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin SiO2 films", Applied Physics Letters, 1989, pp. 128-130, vol. 55.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. dated Nov. 14, 2012.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Notice of Allowance for U.S. Appl. No. 12/939,824, dated Jul. 24, 2012.
Notice of Allowance for U.S. Appl. No. 13/532,019, dated Nov. 14, 2012.
Office Action for U.S. Appl. No. 13/564,639, dated Mar. 19, 2013.
John S. Suehle et al., "Temperature dependence of soft breakdown and wear-out in Sub-3 nm SiO2 films", 38th Annual International Reliability Physics Symposium, 2000, pp. 33-39, San Jose, California.
Woonki Shin et al., "Effect of Native Oxide on Polycrystalline Silicon CMP", Journal of the Korean Physical Society, Mar. 2009, pp. 1077-1081, vol. 54, No. 3.
Office Action for U.S. Appl. No. 13/447,036, dated Jul. 9, 2013.
Office Action for U.S. Appl. No. 13/764,698, dated Jul. 11, 2013.
Office Action for U.S. Appl. No. 13/481,600, dated Sep. 20, 2013.
Office Action for U.S. Appl. No. 13/564,639, dated Dec. 6, 2013.
Notice of Allowance for U.S. Appl.No. 13/461,725, dated Nov. 13, 2013.
Office Action for U.S. Appl. No. 13/870,919, Dated Apr. 3, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.

* cited by examiner

ON/OFF RATIO FOR NON-VOLATILE MEMORY DEVICE AND METHOD

BACKGROUND

The present invention is in general related to switching devices. More particularly, embodiments of the present invention provide a method and a structure for a resistive switching device. The resistive switching device can be used in a non-volatile resistive switching memory device with random access and fast switching characteristics.

Semiconductor memory cells usually include a transistor device. Scaling of memory devices is therefore driven by reducing the size of the transistor. However, fundamental difficulties with scaling commonly used memory cells, such as those using floating gates, are driving the industry to examine a new memory cell structure that will allow scaling to ever smaller dimensions. New classes of memory devices being actively investigated include ferroelectric RAM (Fe RAM), magneto-resistive RAM (MRAM), organic RAM (ORAM), and phase change RAM (PCRAM). These devices usually attempt to use new materials and combine with silicon based devices to create a memory cell.

These new memory cells are often limited in certain desirable attributes. For example, shrinking the device size may not be not possible, or the device may lack high speed switching. For example, Fe-RAM and MRAM devices have fast switching characteristics but scaling them to small sizes is rather difficult. One of the factors that limits the ability to reduce MRAM size is the number of contacts, or terminals, needed to enable the device. A MRAM cell has at least three terminals. A MRAM cell containing at least one transistor coupled with a magnetic switch has a size of $16F^2$, or greater, where F is the printed feature size. For a PCRAM, in which switching occurs when a material is changed from a conductive polycrystalline phase to a less conductive amorphous phase, a relatively large amount of power is needed to switch the device, resulting in slow program/erase for large files. ORAM is usually incompatible with large volume silicon based fabrication. Key attributes of a memory cells should include: the ability to scale to a small size, fast switching speeds, low power consumption, low fabrication cost, long endurance (the ability to read, program, and erase the device multiple times without degradation), and compatibility with current large volume silicon fabrication processes, among others.

Because of these limitations, an improved semiconductor device structure for memory devices is therefore desirable.

BRIEF SUMMARY OF THE PRESENT INVENTION

The present invention is in general related to switching devices. More particularly, embodiments of the present provide a method and a structure for a resistive switching device. The resistive switching device can be used in a non-volatile resistive switching memory with random access and fast switching characteristics. However, it should be recognized that the present invention can have a broader range of applicability.

In a specific embodiment, a method for forming a switching device is provided. The method includes providing a substrate. The substrate can be a semiconductor having one or more transistor devices formed thereon. The method includes forming a first dielectric material overlying a surface region of the substrate and depositing a bottom conductive material stack overlying the dielectric material. The bottom conductive material stack may comprise of one or more layers. In a specific embodiment, the method deposits a switching material overlying the first conductive material stack. A masking layer is formed overlying the switching material. In a specific embodiment, the method subjects the bottom conductive material stack and the switching material to a first etching process using the masking layer to form a first structure, and to expose a surface region of the first dielectric material. In a specific embodiment, the first structure, including at least a first conductive material stack and a switching element, has a top surface region and a side region. A second dielectric material is formed overlying the first structure and the exposed portion of the first dielectric material. The method includes forming a planarized second dielectric surface region and maintaining a portion of the second dielectric material overlying the top surface region of the first structure. In a specific embodiment, the method forms a first opening region in the second dielectric layer to expose a portion of the top surface region of the first structure. The first opening region has a side region and a bottom region. The bottom region includes the exposed top surface region of the switching element and has a first area. A third dielectric material is formed conformably overlying at least the first opening region. The third dielectric material is subjected to a nonconformal etching process or an anisotropic etching process to form a second opening region in a specific embodiment. The nonconformal etching process removes a first portion of the third dielectric material to expose a first portion of the bottom region with a second area while a second portion of the third dielectric material remains on the side region to form a sidewall structure overlying the side region of the first opening region. In a specific embodiment, the second area of the exposed switching material is smaller than the first area of the exposed switching material. The method includes depositing a conductive material overlying the exposed portion of the bottom region and the sidewall structure. In a specific embodiment, the conductive material is in contact with the switching element. A top wiring is formed by a second etching process to form a top wiring structure. The top wiring structure is in electrical contact with the switching material. The top wiring structure and the bottom wiring structure are arranged at an angle, including orthogonally, in a specific embodiment.

In an alternative embodiment, a switching device is provided. The switching device includes a substrate and a first dielectric material overlying the substrate. A bottom wiring structure overlies the first dielectric material. In a specific embodiment, the switching device includes a first structure comprising at least a contact material overlying the bottom wiring structure and a switching material overlying the contact material. The first structure includes a top surface region and a side region. The top surface region includes a top region of the switching material in a specific embodiment. The switching device includes a second dielectric layer overlying the first structure. The switching device includes a side wall spacer structure is provided in a first opening region of the second dielectric layer overlying the top surface region of the switching material. The side wall spacer structure is formed using a third dielectric material. The switching device includes a top wiring structure overlying the switching material. In a specific embodiment, a portion of the top wiring structure includes a conductive material in contact with the switching material.

Many benefits can be achieved by ways of the present invention. As merely an example, the present method provides a method and a structure for fabricating a switching device having an improved switching characteristic such as a greater ratio of the "on" current during read, Ion, to the "off" current during read, Ioff. Such an improvement is realized by providing a reduced active device area for switching, for example less than about 50 nm. Conventionally, this reduction of active area can be realized by using a lithography mask having fine feature size. But the cost of fabricating such a mask can be prohibitively high. Also, yield (defined by, or number of "good" die divided by the total number of die on a wafer), for a step with an extremely small lithographically printed feature size is reduced compared to the yield for a step with a larger feature size. The present method uses a dielectric spacer structure to provide a reduced active area for switching and eliminating a costly and potentially low yield lithography process. In addition, the present method can provide flexibility for device design by allowing adjustment for the active device area and improving device performance and yield. Depending on the embodiment, one or more of these benefits may be realized. One skilled in the art would recognize other variations, modifications, and alternatives.

DETAIL DESCRIPTION OF THE PRESENT INVENTION

The present invention is in general related to switching devices. More particularly, embodiments of the present invention provide a method and a structure for a resistive switching device. The resistive switching device may be used in non-volatile memory devices that provide for random access, fast switching, and are scalable to very small sizes. But it should be recognized that the present invention can have a much broader range of applicability.

Resistive switching behavior has been observed and studied in micrometer-scale amorphous silicon (a-Si) devices since the 1980s. A typical device consists of a pair of metal electrodes sandwiching an amorphous-Si layer in a so-called Metal/a-Si/Metal (M/a-Si/M) structure, in which the voltage applied across the pair of metal electrodes may cause changes in the a-Si resistance. These conventional M/a-Si/M based nonvolatile switching devices have the advantages of high Ion/Ioff ratios, and can be fabricated with a CMOS compatible fabrication process and materials. Due to the highly resistive a-Si material, the as-fabricated devices have a high resistance and negligible current flow between the top and bottom electrodes during read. Before these devices can be used as a switching device, a high voltage forming process (typically greater than 10 V) is used to transform the as-fabricated device into a low resistance state. This high voltage significantly reduces device yields, as some devices can be destroyed by the high voltage. This high forming voltage is increasingly destructive as the device is scaled down to smaller sizes, such as nanometer-sized range.

Figure 1:
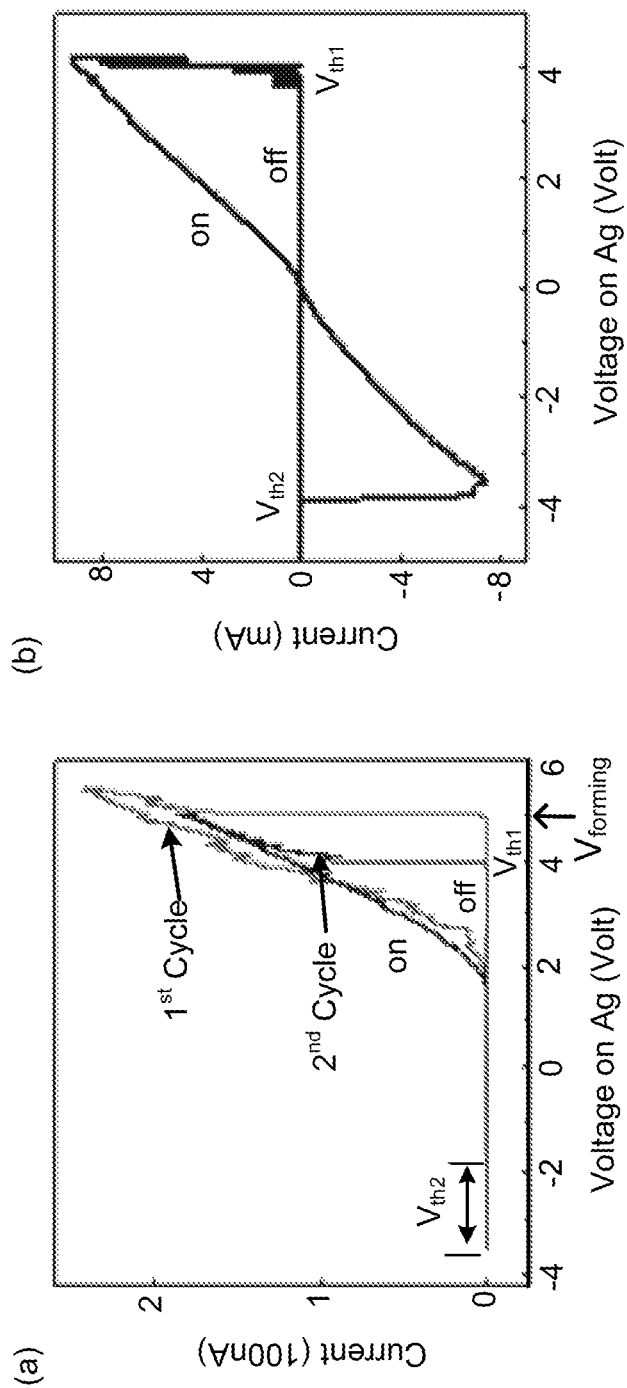
FIG. 1 illustrates simplified current versus voltage (IV) plots of a resistive switching device.

Embodiments of the present invention use a Metal/amorphous-Si/p+ polycrystalline silicon structure. This structure has a much smaller forming voltage $V_{th1}$, ranging from about 3 volts to 4 volts depending on the deposition method of the amorphous Si layer and the type of the top metal material. The resistance of the device is suddenly reduced once the forming voltage is applied. The device is turned on and significant current flows through the device, as shown in FIG. 1. If a voltage of opposite polarity (negative voltage in this case) is applied on the top metal electrode greater than a threshold $V_{th2}$, typically ranging from −2V to −4V in magnitude, the device is changed back into a high resistance state, i.e., in an "off" state. The OFF state resistance can be comparable to the resistance of as-fabricated devices. The device state resistance is not affected if the applied voltage is between the $V_{th1}$ and $V_{th2}$. The ratio between the currents at ON state and OFF states, or $I_{on}/I_{off}$, ranges from about $10^3$ to about $10^7$ depending on the device type.

Figure 2:
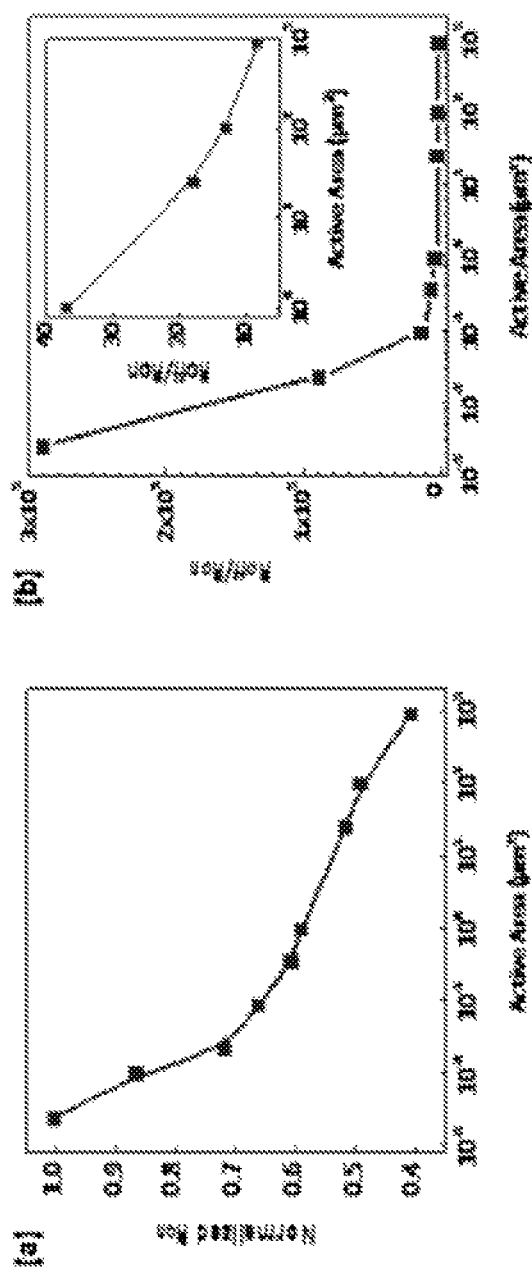
FIG. 2 illustrates simplified plots of the dependence of device resistance on active device area at ON state and at OFF state.
Figure 3:
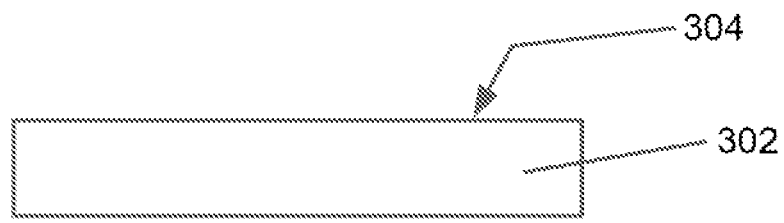
FIGS. 3-18 are simplified diagrams illustrating a method of forming a two terminal switching devices according to an embodiment of the present invention.

FIG. 2 shows the dependence of ON state resistance on active device area. As shown, the on-resistance increases only 2.5 times when the active device area is reduced by 6 orders of magnitude in size. Therefore, the ON state resistance or ON state current is relatively insensitive to the total device area. In the OFF state, conduction is dominated by leakage through the amorphous Si layer. The OFF state current $I_{off}$ is inversely proportional to the device area and sensitive to the total device area. As a result, the $I_{on}/I_{off}$ ratio can be increased by making smaller devices, which is an effect that actually favors down scaling of device sizes. An improved $I_{on}/I_{off}$ ratio improves a signal-to-noise ratio for selected devices during read, allowing for a large and high density array of devices, thereby reducing costs of fabrication.

Accordingly, the present invention provides a method and a structure for forming a switching device, in particular, a resistance switching device having a reduced active device area to increase an $I_{on}/I_{off}$ ratio.

Figure 4:
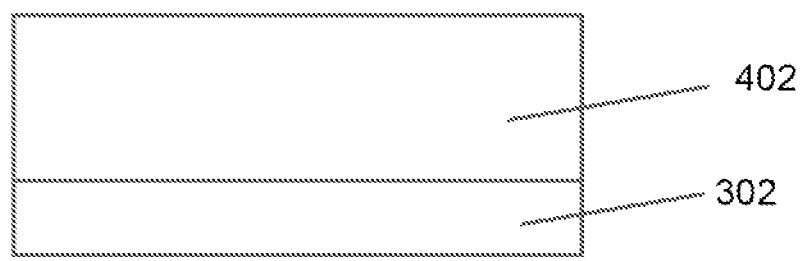

FIGS. 3-18 illustrate a method of fabricating a switching device according to an embodiment of the present invention. The method includes providing a substrate 302 including a surface region 304. The substrate can be a semiconductor substrate such as a silicon wafer and the like. In certain embodiments, the substrate can include one or more devices formed thereon. The one or more devices can include transistor devices, and/or others, depending on the embodiment. As shown in FIG. 4, the method includes forming a first dielectric material 402 overlying the surface region of the substrate. The first dielectric material can be a silicon oxide or a silicon nitride or a suitable dielectric film stack including combinations of different dielectric films. The first dielectric material can be formed using techniques such as chemical vapor deposition, spin on coating, and/or a combination of these techniques. One of skill in the art will appreciate that other similar techniques may be suitable for the forming process.

Figure 5:
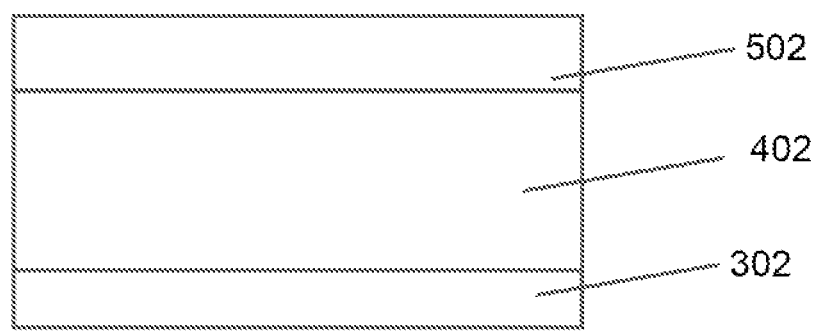
Figure 6:
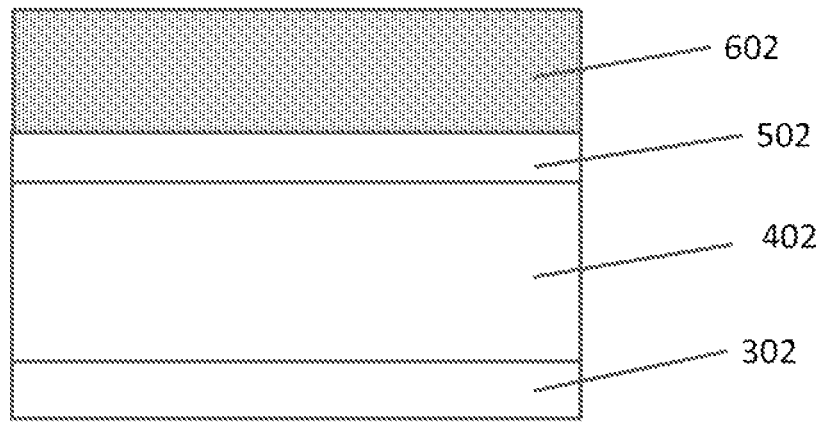

Referring to FIG. 5, the method deposits a first adhesion layer 502 overlying the first dielectric material. The first adhesion layer can be titanium, titanium nitride, tantalum, tantalum nitride, tungsten nitride, or any combinations of these or other similar materials. The first adhesion layer may be formed using physical vapor deposition, chemical vapor deposition, or atomic layer deposition, and the like. In other applications, physical deposition such as sputtering may be used depending on the application. As shown in FIG. 6, a bottom wiring structure 602 is formed overlying the first adhesion layer. The bottom wiring structure material can be aluminum, tungsten, copper, or other suitable metal materials depending on the embodiment. The bottom wiring material can be deposited using techniques such as physical vapor deposition, evaporation, chemical vapor deposition, electrochemical methods such as electroplating or electrode-less deposition from a liquid medium, or other suitable deposition techniques, or combinations of techniques. In an embodiment shown in FIG. 5, the first adhesion layer facilitates adhesion between the first wiring material and the first dielectric material.

Figure 7:
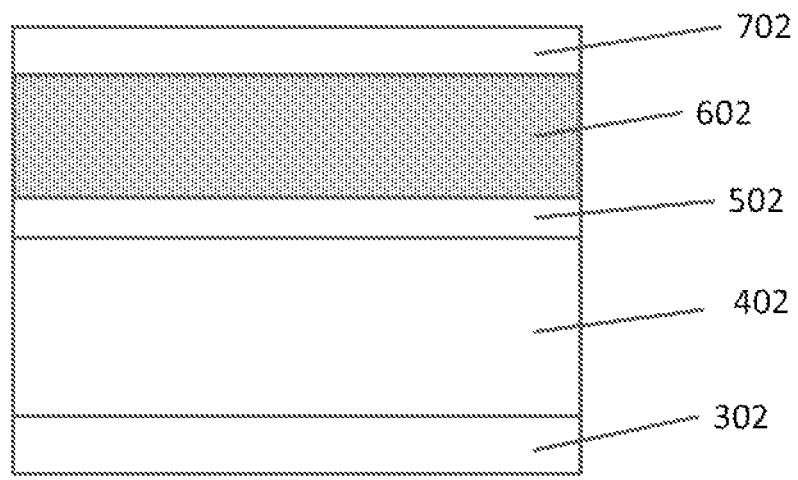

As shown in FIG. 7, a method of forming the switching device includes depositing a second adhesion layer 702 onto the bottom wiring structure material. The second adhesion layer can serve as a barrier layer or a blocking layer to prevent chemical reaction of the bottom wiring structure material with, for example, a switching layer material subsequently formed. The second adhesion layer can be titanium, titanium nitride, tantalum, tantalum nitride, tungsten, tungsten nitride, or others, depending on the embodiment.

Figure 8:
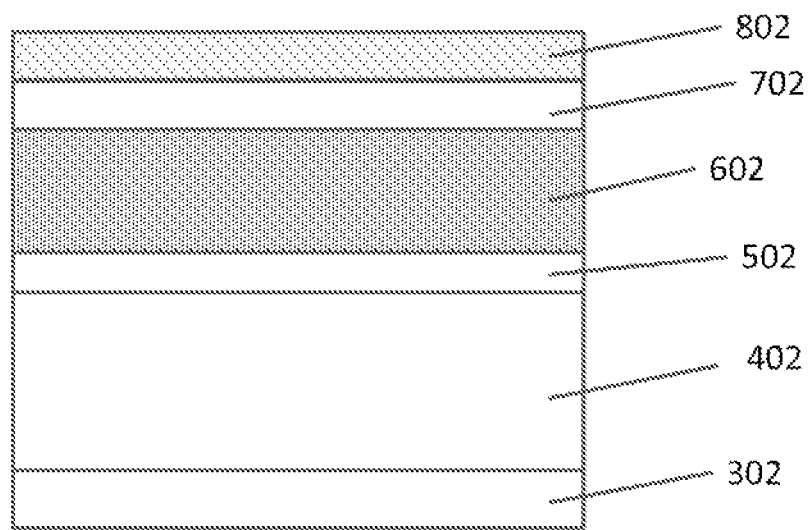

Referring to FIG. 8, the method includes forming a doped semiconductor material. 802 overlying the second adhesion layer in a specific embodiment. The doped semiconductor material can be doped polycrystalline silicon, hereinafter referred to as polysilicon. The polysilicon material is used as a contact material between the bottom wiring material and an amorphous silicon switching material in a specific embodiment. In a preferred embodiment, the doped polysilicon material is p$^+$ doped, using impurity such as boron and the like. In some embodiments, the boron has a concentration ranging from about 1E18 to 1E21 cm$^{-3}$. The p+ polycrystalline silicon material can be deposited using a chemical deposition method or a physical deposition method depending on the embodiment. The chemical deposition method can include a chemical vapor deposition process using silane, disilane, a suitable chlorosilane, or any suitable silicon-containing gas as a precursor, and any suitable gas containing a p+ dopant for silicon, such as diborane, $B_2H_6$. In a specific embodiment, the p+ polycrystalline silicon material may be deposited using a plasma-assisted chemical deposition method. Deposition temperature for the p+ silicon material can range from about 200 Degrees Celsius to about 500 Degrees Celsius and preferably at about 400 Degrees Celsius to about 450 Degrees Celsius. In certain embodiments, the polysilicon material may be further processed to enhance the performance of the switching device. For example, defects or nano metal material may be formed in a surface region of the doped polysilicon material to enhance the performance of the switching device. In a specific embodiment, the polysilicon material allows for controlling and improving switching properties of the amorphous silicon switching material. For other switching materials, such as metal oxide, or others, other contact material may be used, or the contact layer may not be needed. Of course, one skilled in the art would recognize other variations, modifications, and alternatives.

Figure 9:
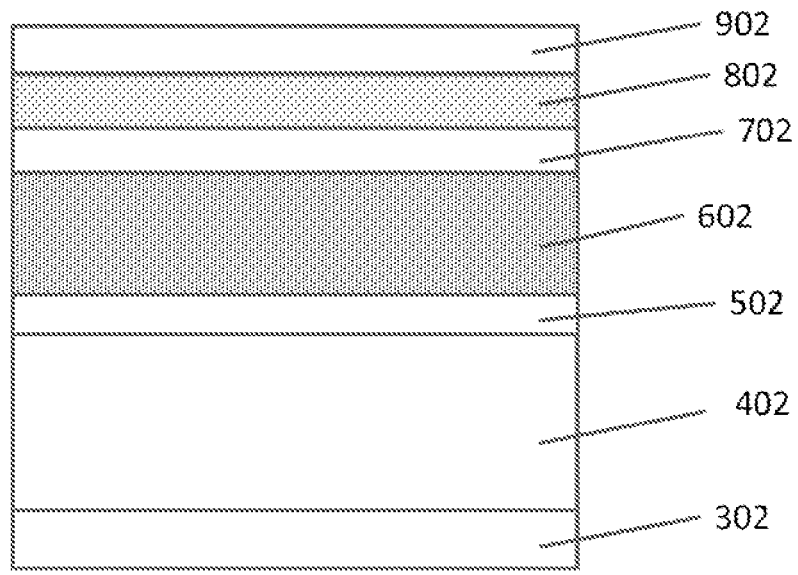

In a specific embodiment, the method forms a switching material 902 overlying the contact material as shown in FIG. 9. The switching material can be an undoped amorphous silicon material having an intrinsic semiconductor characteristic. The undoped amorphous silicon material can be deposited using a chemical deposition method or a physical deposition method depending on the embodiment. The chemical deposition method can include a chemical vapor deposition process using silane, disilane, a suitable chlorosilane, or any suitable silicon-containing gas as a precursor. In a specific embodiment, the undoped amorphous silicon material may be deposited using a plasma-assisted chemical deposition method. Deposition temperature for the amorphous silicon material can range from about 200 Degrees Celsius to about 450 Degrees Celsius and preferably at about 350 Degrees Celsius to about 400 Degrees Celsius. Depending on the embodiment, the amorphous silicon material can be provided at a thickness ranging from about 50 Angstroms to about 1000 Angstroms. In a preferred embodiment, the amorphous silicon material is provided at a thickness ranging from about 100 Angstroms to about 500 Angstroms.

Figure 10:
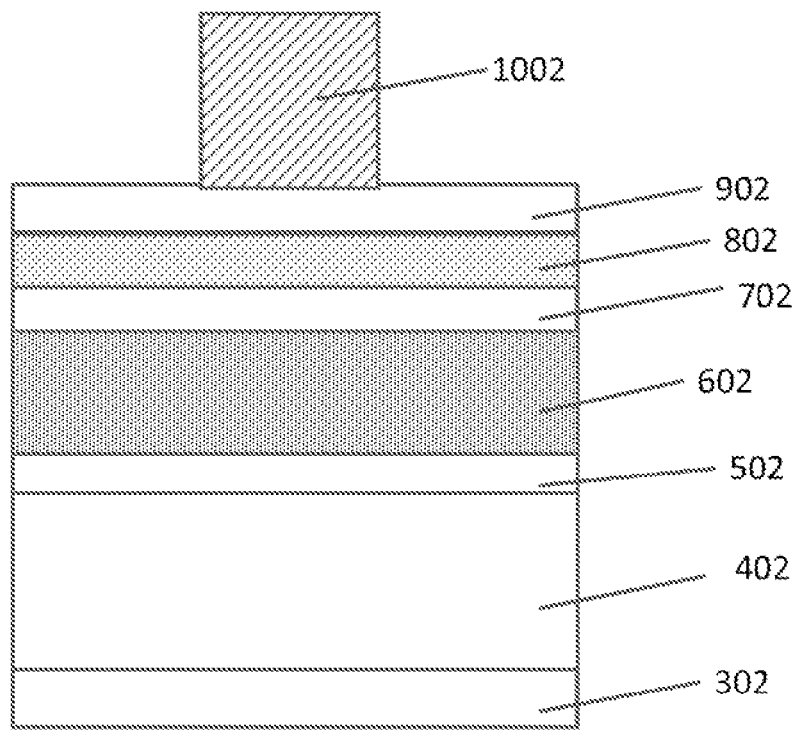

Referring to FIG. 10, the method includes forming a masking layer 1002 overlying the switching material. The masking layer can be a suitable organic photoresist material, or an inorganic hard mask, or a combination of the two, depending on the embodiment. The hard mask can be formed from a dielectric material such as silicon oxide or silicon nitride, or others depending on the application. The hard mask may also be a metal hard mask depending on the embodiment.

Figure 11:
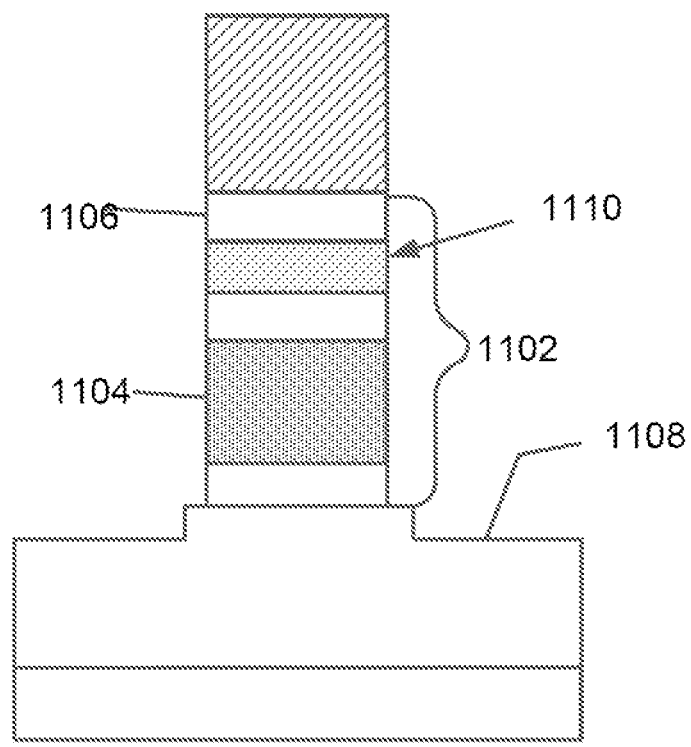

In a specific embodiment, the method subjects the switching material, the contact material, and the bottom wiring structure material to a first etching process using the masking layer as a mask to form a first structure 1102 as shown in FIG. 11. The first etching process selectively removes a portion of the first dielectric material exposing a top surface region 1108 of the first dielectric material. The first structure includes at least a bottom wiring structure 1104, and a switching element 1106 in a specific embodiment. The switching element includes at least a first side region 1110. Depending on the hard mask used, any remaining portion of the hard mask after etching may be removed. Alternatively, the remaining hard mask after etch may be left intact if it is a dielectric.

Figure 12:
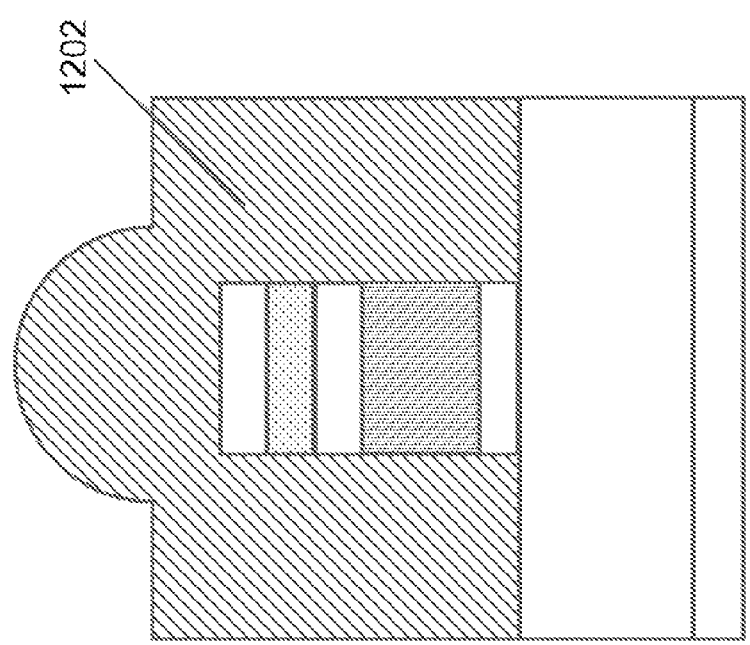
Figure 14:
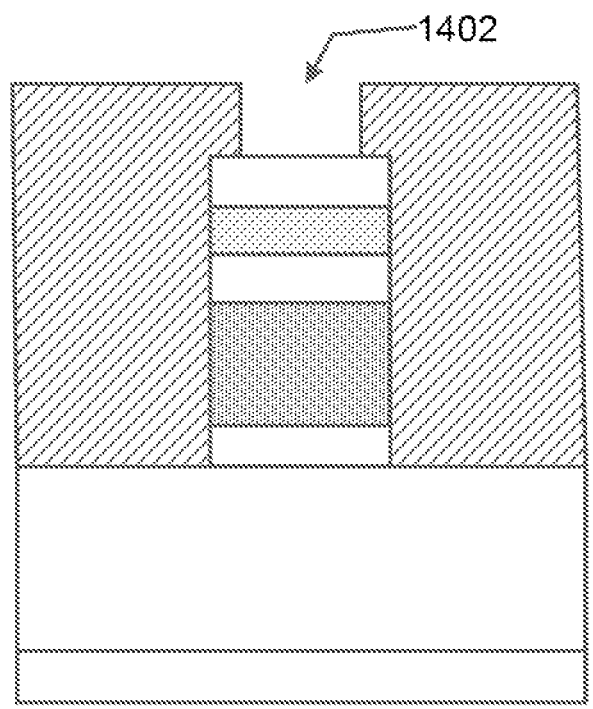
Figure 15:
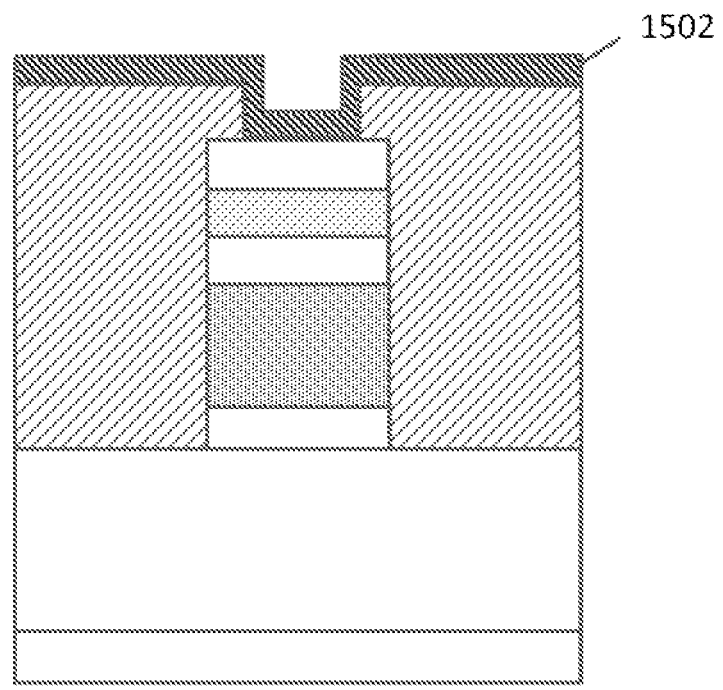

Referring to FIG. 12, the method includes depositing a second dielectric layer 1202 overlying the first structure and exposed portion of the first dielectric layer. The second dielectric material can include a silicon oxide material, a silicon nitride material, or any other suitable dielectric or combination of dielectrics depending on the embodiment. In a specific embodiment, the second dielectric material can be silicon oxide deposited using a plasma enhanced chemical vapor deposition process using tetraethyloxysilicate (commonly known as TEOS), as a precursor. The silicon oxide material may also be formed using a spin on coating technique followed by a suitable curing process. A combination of coating and chemical deposition may also be used depending on the application.

Figure 13:
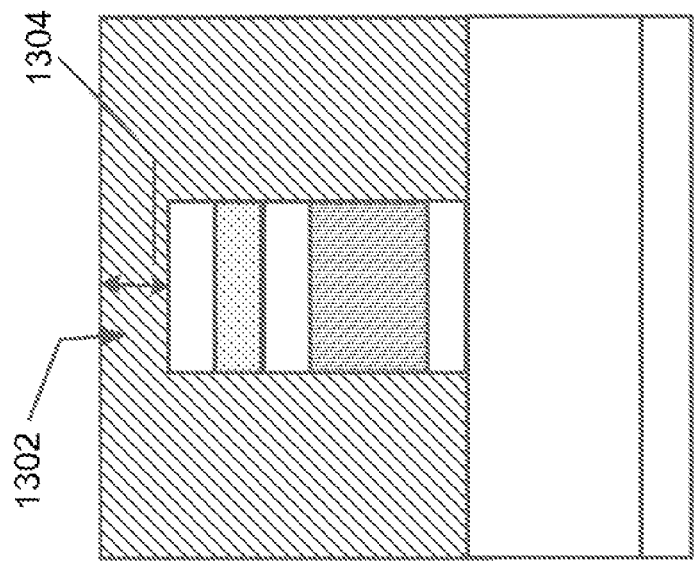

In a specific embodiment, the method employs a planarizing process to form a planarized dielectric surface 1302 as illustrated in FIG. 13. This may be accomplished by a chemical mechanical polishing process, or a non isotropic chemical etch, for example, a blanket etch of the second dielectric material. As shown, a portion 1304 of the second dielectric material is maintained overlying a top region of the switching element. For the embodiment shown in FIG. 14, the method includes forming a first opening region 1402 in a portion of the second dielectric material to expose a portion of the top region of the switching element. The first opening region is formed by using a second patterning and etching process and has a first dimension in a specific embodiment. For example, when silicon dioxide as the dielectric material, the etching process may be a dry etch, such as a fluorine-based etching using $CF_4$, $SF_6$, or $NF_3$, as the etching gas. A suitable wet etching technique, such as a BF-based etching may also be used depending on the embodiment. Alternatively, laser ablation may be used to selectively remove the silicon oxide material overlying the switching material to form the first opening region.

In an embodiment shown in FIG. 5, the method includes forming a third dielectric material 1502 overlying the second dielectric material including the first opening region. As shown, the third dielectric material is conformably formed to overly the second dielectric material and the first opening region in a specific embodiment. The third dielectric material can be silicon nitride in a specific embodiment. Other suitable dielectric materials such as silicon oxide or a dielectric stack (for example, a silicon oxide on silicon nitride on silicon oxide stack, commonly known as ONO) may also be used depending on the embodiment.

Figure 16:
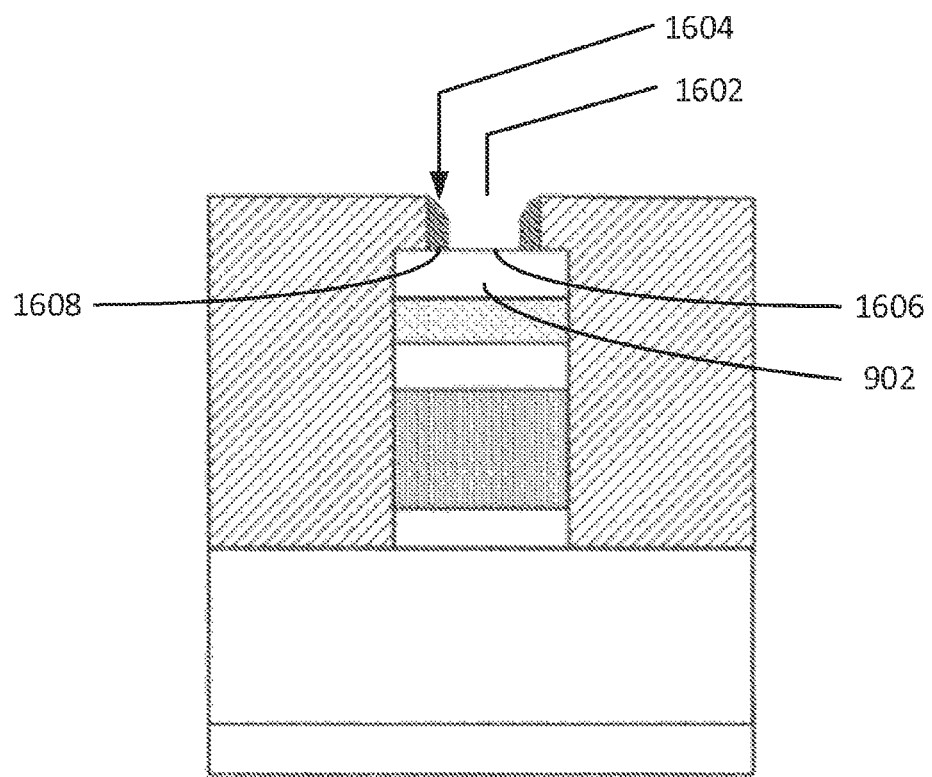

Referring to FIG. 16, the method subjects the third dielectric material to a nonconformal or an anisotropic etching process to remove a portion of the third dielectric material to form a second opening region 1602. As shown, the anisotropic etching process forms a side wall structure 1604 overlying the side region of the first opening region and a bottom region thereof. The bottom region includes an exposed portion 1606 of the switching material and a covered portion 1608 of the switching material 902 in a specific embodiment. This etch is commonly used in semiconductor processing, and is known as a "sidewall spacer" etch. The exposed portion has a second dimension, which is less than the first dimension.

Figure 17:
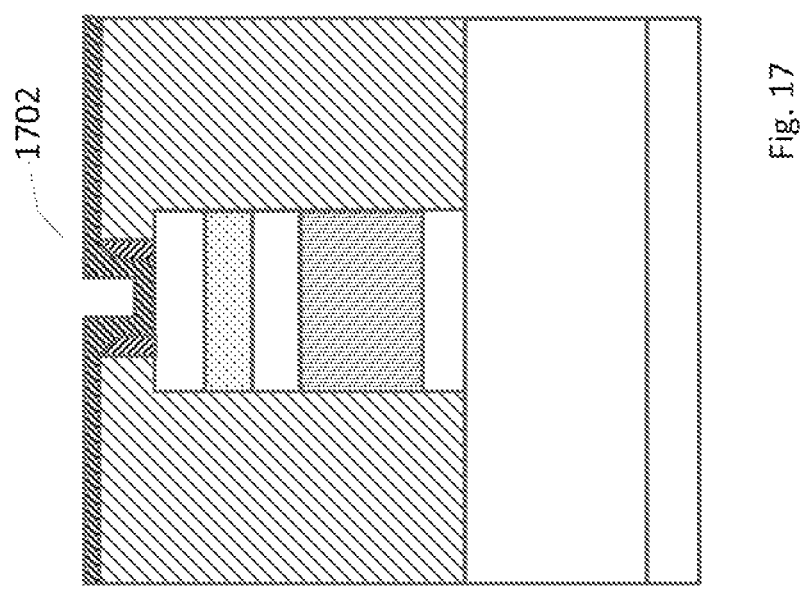

Referring to FIG. 17, the method shown in this embodiment includes forming a conductive material 1702 overlying at least the bottom region and the side wall structure. The conductive material can substantially fill the second opening region and be in contact with the switching material in a specific embodiment. Alternatively, the conductive material can be conformably formed overlying the second opening region including the bottom region and the side wall structure depending on the deposition conditions. The conductive material is in contact with the switching element, as shown. In a specific embodiment, for an amorphous silicon switching material, the conductive material can be a silver material. The silver material can be deposited using a physical deposition process such as sputtering or evaporation. The silver material may also, be formed using a chemical deposition process such as chemical vapor deposition, an electrochemical process such as electroplating or electroless plating, or a combination of processes depending on the application.

Figure 18:
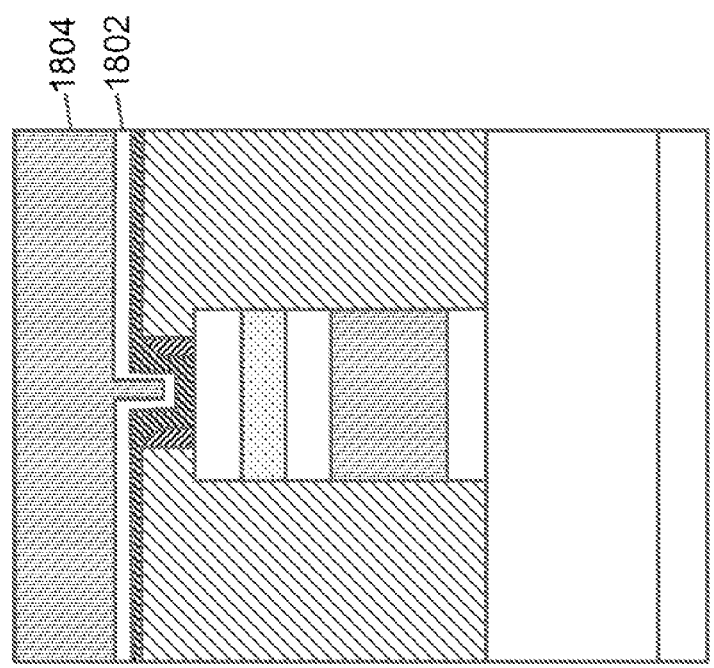

An embodiment of the method shown in FIG. 18, includes forming a top barrier material 1802 overlying at least the conductive material and a top wiring material 1804 overlying the top barrier material. The top barrier material can be a top adhesion material in a specific embodiment. The top barrier material can be titanium, titanium nitride, tantalum, tantalum nitride, tungsten, tungsten nitride, or any suitable barrier material depending on the embodiment. Depending on the application, top barrier material 1802 can be formed using a chemical deposition process such as atomic layer deposition, chemical vapor deposition, and others, or a physical deposition process such as sputtering, depending on the application. Top barrier material 1802 can protect the conductive material. For example, if the conductive material is silver material in a certain embodiment, the top barrier material can prevent oxidation of the silver. The top barrier material can also be a diffusion barrier between the conductive material and the top wiring material in a specific embodiment.

Again, depending on the embodiment, the top wiring material can be aluminum, tungsten, copper, or others. The top wiring structure material may be deposited using techniques such as a physical vapor deposition process, for example, sputtering, evaporation, and others. The top wiring material may also be deposited using chemical deposition such as chemical vapor deposition, or electrochemically including electroplating and electrodeless deposition depending on the embodiment.

In a specific embodiment, the method subjects a stack of material comprising the top wiring material, the top barrier material, and the contact material to a third pattern and etch process to from a top wiring structure. In a specific embodiment, the conductive material is in contact with the switching element. The top wiring structure is configured spatially at an angle to the bottom wiring structure to form a crossbar structure in a specific embodiment. In a specific embodiment, the top wiring structure is configured spatially orthogonal to the bottom wiring structure. The switching element is disposed in an intersection region of the top electrode structure and the bottom electrode structure. As an example, for a switching device using an amorphous silicon, material as the switching material, the stack of material can comprise aluminum, titanium nitride, and silver, while silver is in contact with the amorphous silicon material. One skilled in the art would recognize other variations, modifications, and alternatives to the methods, materials and structures described above.

In a specific embodiment, the conductive material forms a plurality of conductive material particles including a filament structure in a portion of the switching material when a suitable voltage is applied to the top wiring structure or the bottom wiring structure. Formation of this filament changes the resistance of the switching material in a specific embodiment. Taking silver material as the conductive material and amorphous silicon as the switching material as an example, upon applying a positive voltage to the top wiring structure, a plurality of silver particles are formed in defect regions of the amorphous silicon material. The plurality of silver particles can include a silver filament structure having a length. The length of the silver filament structure can change upon applying a suitable voltage, thus changing the resistance of the amorphous silicon material. Such a device structure is described in U.S. application Ser. No. 11/875,541, filed on. Oct. 19, 2007, commonly assigned, and incorporated by reference in its entirety herein.

In a specific embodiment, a switching device is provided. The switching device includes a substrate and a first dielectric material overlying the substrate. The substrate is a semiconductor substrate in a specific embodiment. The substrate can include one or more CMOS devices formed thereon and operably connected to the switching device in certain embodiments. The switching device includes a bottom wiring structure overlying the first dielectric material. The bottom wiring structure includes at least a metal material selected from tungsten, copper, and aluminum in a specific embodiment.

In a specific embodiment, the switching device includes a first structure. The first structure includes at least a contact material overlying the bottom wiring structure and a switching material overlying the contact layer. In an embodiment, the contact material includes a p+ doped polysilicon material, and the switching material, includes an amorphous silicon material. In certain embodiments, the p+ doped polysilicon material is doped using boron as the impurity at a concentration ranging from about 1E18 to about 1E21 atoms per $cm^3$ depending on the application. The p+ doped silicon material can have a thickness ranging from about 50 Angstroms to about 2000 Angstroms and preferably 100 Angstroms to about 500 Angstroms. Depending on the embodiment, the amorphous silicon material can have a thickness ranging from 50 Angstroms to about 2000 Angstroms and preferably 100 Angstroms to about 500 Angstroms. In a specific embodiment, the first structure has a top surface region and a side region, the top surface region including a top region of the switching material. The switching device includes a second dielectric layer overlying the first structure and a side wall spacer structure provided in a first opening region of the second dielectric layer. The first opening region includes a portion of the top surface region of the switching material. In a specific embodiment, the side wall spacer structure is formed using a third dielectric material. The third dielectric material can be silicon nitride in a specific embodiment. The first opening region defines an active device area in a specific embodiment.

In a specific embodiment, the present switching device includes a conductive material overlying the first opening region. The conductive material overlies the side wall structure and the conductive material is in contact with the switching material in a preferred embodiment. A top wiring structure overlies the conductive material in a specific embodiment. The conductive material can be silver, gold, platinum, or palladium, an alloy of these metals, or a combination, depending on the application. For amorphous silicon as the switching material, the conductive material can use silver at a thickness ranging from 50 Angstroms to about 2000 Angstroms in a specific embodiment. The top wiring structure can include a metal material selected from tungsten, copper, and aluminum depending on the embodiment.

In a specific embodiment, the switching device is further characterized by an ON state current and an OFF state current. The ON state current is independent of an area of the first opening region and the OFF state current being inversely proportional to the area in a specific embodiment.

Accordingly, embodiments of the present invention provide a method and a device structure to form a switching device having an increased ON current to OFF current ratio. Such increase is provided by forming a side wall structure to reduce an active device area without using a lithography mask, which can be costly for fine feature size less than about 50 nm. The active device area is defined by a contact region of the top wiring structure and the switching material, for example between conductive material and the switch material in a specific embodiment. Though the present method has been applied to a device structure having an Ag/amorphous silicon/p+ polysilicon configuration and tungsten material as the top wiring material and the bottom wiring material, it should be recognized that the present method can be applied in fabrication of a switching device where switching is dependent on the mechanism of forming a conductive path or conductive particles in a switching material.

It is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A switching device, comprising:
   a substrate having a surface region;
   a first dielectric material overlying the surface region of the substrate;
   a bottom wiring structure overlying the first dielectric material;
   a first structure comprising at least a contact material overlying the bottom wiring structure and a switching material overlying the contact layer, the first structure having a top surface region substantially parallel to the surface region of the substrate, the top surface region including a top region of the switching material, wherein the switching material is configured to allow a conductive filament to form therein;
   a second dielectric layer overlying the first structure, wherein the second dielectric layer comprises a sidewall and an opening region exposing a first portion and a second portion of the top region of the switching material;
   a side wall spacer structure disposed within the sidewall of the opening region of the second dielectric layer, wherein the side wall spacer structure covers the first portion of the top surface of the switching material but not the second portion of the top surface region of the switching material, the side wall spacer structure being formed using a third dielectric material;
   a conductive material overlying the side wall spacer structure, the conductive material overlying and in contact with the second portion of the top surface region of the switching material but not the first portion of the top surface region of the switching material, and wherein the conductive material is a source of conductive particles for the conductive filament; and
   a top wiring structure overlying the conductive material.

2. The device of claim 1 wherein the first dielectric material comprises silicon oxide or silicon nitride or a silicon oxide on silicon nitride on silicon oxide stack.

3. The device of claim 1 wherein the second dielectric material comprises silicon oxide.

4. The device of claim 1 wherein the third dielectric material comprises silicon nitride, silicon oxide, or a dielectric stack, the dielectric stack comprises a silicon oxide on silicon nitride on silicon oxide (ONO) stack.

5. The device of claim 1 wherein the second portion of the top surface region of the switching material defines an active device region.

6. The device of claim 1 further characterized by an on-state current and an off-state current, the on-state current being independent of an area of the second portion of the top surface-region and the off-state current being inversely proportional to the area.

7. The device of claim 1 wherein the top wiring structure and the bottom wiring structure are spatially arranged in a crossbar configuration.

8. The device of claim 1 wherein the substrate is a semiconductor substrate.

9. The device of claim 1 wherein the substrate comprises one or more COMS device formed thereon, the one or more CMOS devices being operably coupled to the switching device.

10. The device of claim 1 wherein at least a portion of the top wiring structure and at least a portion of the bottom wiring structure comprise a metal material selected from a group consisting of: tungsten, copper, and aluminum.

11. The device of claim 1 wherein the contact material comprises a polysilicon material having a p+ impurity characteristic, the p+ impurity characteristic being provided by a boron species at a concentration ranging from about $10^{17}$ cm$^3$ to about $10^{21}$ cm$^3$.

12. The device of claim 1 wherein the polysilicon material has a thickness ranging from about 50 Angstroms to about 2000 Angstroms.

13. The device of claim 1 wherein the polysilicon material has a thickness ranging from about 100 Angstroms to about 500 Angstroms.

14. The device of claim 1 wherein the switching material comprises an amorphous silicon material having an intrinsic semiconductor characteristic.

15. The device of claim 14 wherein the amorphous silicon material has a thickness ranging from about 50 Angstroms to about 2000 Angstroms.

16. The device of claim 14 wherein the amorphous silicon material has a thickness ranging from about 100 Angstroms to about 500 Angstroms.

17. The device of claim 1 wherein the conductive material is a metal material selected from a group consisting of: gold, silver, platinum, and palladium.

18. The device of claim 17 wherein the conductive material comprises a silver material having a thickness ranging from about 50 Angstroms to about 2000 Angstroms.

19. The device of claim 17 wherein the conductive material comprises a silver material having a thickness ranging from about 100 Angstroms to about 500 Angstroms.

\* \* \* \* \*